(12) United States Patent
Okkel et al.

(10) Patent No.: US 12,116,492 B2
(45) Date of Patent: Oct. 15, 2024

(54) NON-PIGMENTED DISPERSANT COMPOSITION

(71) Applicant: BYK-Chemie GmbH, Wesel (DE)

(72) Inventors: Andreas Okkel, Wesel (DE); Hiroshi Yonehara, Hyogo (JP); Benjamin Lindner, Rudenhausen (DE); Jörg Bömer, Wesel (DE); Albert Frank, Xanten (DE); Udo Krappe, Wesel (DE); Ryo Takabayashi, Hyogo (JP); Yoshizumi Kohara, Osaka (JP)

(73) Assignee: BYK-Chemie GmbH, Wesel (DE)

( * ) Notice: Subject to any disclaimer, the term of this patent is extended or adjusted under 35 U.S.C. 154(b) by 502 days.

(21) Appl. No.: 17/605,458

(22) PCT Filed: Apr. 22, 2020

(86) PCT No.: PCT/EP2020/061242
§ 371 (c)(1),
(2) Date: Oct. 21, 2021

(87) PCT Pub. No.: WO2020/216800
PCT Pub. Date: Oct. 29, 2020

(65) Prior Publication Data
US 2022/0213337 A1  Jul. 7, 2022

(30) Foreign Application Priority Data
Apr. 26, 2019 (EP) .................................. 19171337

(51) Int. Cl.
| | |
|---|---|
| C09D 7/45 | (2018.01) |
| C09D 7/65 | (2018.01) |
| C09D 11/037 | (2014.01) |
| C09D 11/107 | (2014.01) |
| C09D 11/322 | (2014.01) |
| C09D 11/326 | (2014.01) |
| C09D 11/328 | (2014.01) |

(Continued)

(52) U.S. Cl.
CPC .............. *C09D 11/107* (2013.01); *C09D 7/45* (2018.01); *C09D 7/65* (2018.01); *C09D 11/037* (2013.01); *C09D 11/322* (2013.01); *C09D 11/326* (2013.01); *C09D 11/328* (2013.01); *C09D 17/001* (2013.01); *G02B 5/223* (2013.01)

(58) Field of Classification Search
CPC .......... C09D 7/45; C09D 7/65; C09D 11/037; C09D 11/107; C09D 11/322; C09D 11/326; C09D 11/328; C09D 17/001; G02B 5/223
See application file for complete search history.

(56) References Cited

U.S. PATENT DOCUMENTS

| | | | |
|---|---|---|---|
| 5,219,945 A | 6/1993 | Dicker | |
| 6,413,306 B1 | 7/2002 | Kraiter | |
| 8,292,452 B2 | 10/2012 | Ogura et al. | |
| 9,260,557 B2 | 2/2016 | Umemoto | |
| 2003/0105201 A1* | 6/2003 | Auschra | ............... C09D 11/326 524/415 |
| 2020/0347171 A1* | 11/2020 | Okkel | ...................... G03F 7/033 |
| 2021/0179764 A1* | 6/2021 | Okkel | ....................... C09D 7/40 |

FOREIGN PATENT DOCUMENTS

| | | |
|---|---|---|
| DE | 2726854 A1 | 1/1979 |
| EP | 0193019 A1 | 9/1986 |

(Continued)

OTHER PUBLICATIONS

International Search Report and Written Opinion for International Application No. PCT/EP2020/061242 dated Jul. 1, 2020 (11 pages).

*Primary Examiner* — Bijan Ahvazi
(74) *Attorney, Agent, or Firm* — Fitch, Even, Tabin & Flannery LLP

(57) ABSTRACT

The invention relates to a non-pigmented composition comprising a) a block co-polymer comprising at least one first block and at least one second block which is different from the first block, wherein the first block comprises repeating units 1, repeating unit 1 and the second block comprises repeating units 2, repeating unit 2 wherein Z represents O or NH, $R^1$ represents H or $CH_3$, $R^2$ represents a group selected from hydrocarbyl groups and ether group-containing groups, $R^3$ represents an organic group having 2 to 4 carbon atoms, $R^4$ and $R^5$ independently represent an organic group, wherein $R^4$ and $R^5$ are optionally linked to each other to form a cyclic structure, and b) a polymer comprising at least one acidic group, and having a number average molecular weight of 300 g/mol or higher.

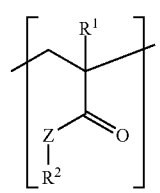

(1)

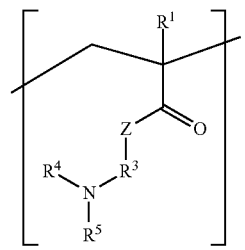

(2)

14 Claims, No Drawings

(51) Int. Cl.
 *C09D 17/00* (2006.01)
 *G02B 5/22* (2006.01)

(56) References Cited

FOREIGN PATENT DOCUMENTS

| | | | | |
|---|---|---|---|---|
| EP | 2626393 | A1 | 8/2013 | |
| EP | 3147335 | | 3/2017 | |
| EP | 3147335 | A1 * | 3/2017 | .......... C08F 293/005 |
| JP | 2004339330 | A | 12/2004 | |
| JP | 2006-343648 | A | 12/2006 | |
| JP | 2010134419 | A | 6/2010 | |
| JP | 2010228218 | A | 10/2010 | |
| JP | 2011-191783 | A | 9/2011 | |
| JP | 4883235 | B2 | 2/2012 | |
| JP | 2013-064983 | A | 1/2013 | |
| JP | 2013203887 | | 10/2013 | |
| JP | 2014028891 | | 2/2014 | |
| JP | 2015-110726 | A | 6/2015 | |
| JP | 2016117874 | A * | 6/2016 | ............ C08F 293/00 |
| JP | 2016148000 | | 8/2016 | |
| JP | 2016-224463 | A | 12/2016 | |
| JP | 2017082198 | | 5/2017 | |
| JP | 6248838 | B2 | 12/2017 | |
| JP | 2018013512 | | 1/2018 | |
| WO | 2019096891 | | 5/2019 | |
| WO | 2019096891 | A1 | 5/2019 | |
| WO | 2020216801 | | 10/2020 | |

* cited by examiner

NON-PIGMENTED DISPERSANT COMPOSITION

The invention relates to a composition comprising a block co-polymer and a polymer having acidic groups. The invention further relates to the use of the compositions as dispersing aid for colorants and to a process of preparing a pigmented composition.

Japanese patent JP 6248838 B relates to a coloring composition comprising a specific diketopyrrolopyrrole derivative as pigment, a polymeric dispersant, a polymeric phosphate ester, a binder resin, and a polymerizable compound. The polymeric dispersant and the polymeric phosphate ester are combined in the presence of the pigment during the pigment dispersion process. The coloring compositions of this document are proposed for use in the production of flat panel displays. It has been found that the pigment dispersion quality and the developing properties of the colored compositions described in this document are sometimes not fully satisfactory.

There is an ongoing need for improved wetting and dispersing agents, which produce in particular a low-viscosity, storage-stable pigment concentrate, for example in the fields of color filters for liquid crystal displays, ink composition for inkjet printing, and other coating compositions. A low viscosity of the pigment concentrate and of the coating material is needed for the application of the coating material to the substrate. If the pigment dispersions are not storage-stable and agglomerate, the viscosity of the pigmented composition generally increases and the contrast is impaired. Moreover the wetting and dispersing agent should have no negative influence on the developing step as for modern color filters the pigment loading is increased and therewith the amount of wetting and dispersing additive which is used in the formulation, too. For use in color filters, a good balance of developing properties and re-solubility in-in organic solvent, in particular in 1-Methoxy-2-propyl acetate, is desirable for obtaining a high productivity in industrial processes. The wetting and dispersing agent should furthermore exhibit a broad compatibility with a variety of other components, such as resins, of compositions wherein it is used. The wetting and dispersing agent should also be suitable for use with a variety of different pigments.

The invention provides a non-pigmented composition comprising a) a block co-polymer comprising at least one first block and at least one second block which is different from the first block, wherein the first block comprises repeating units 1,

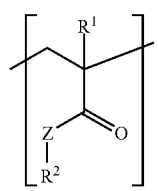

repeating unit 1 and the second block comprises repeating units 2,

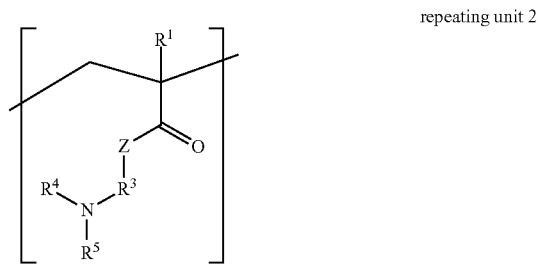

repeating unit 2 wherein
Z represents O or NH,
$R^1$ represents H or $CH_3$,
$R^2$ represents a group selected from hydrocarbyl groups and ether group-containing groups,
$R^3$ represents an organic group having 2 to 4 carbon atoms,
$R^4$ and $R^5$ independently represent an organic group, wherein $R^4$ and $R^5$ are optionally linked to each other to form a cyclic structure, and
b) a polymer comprising at least one acidic group, and having a number average molecular weight of 300 g/mol or higher,
and wherein the composition is essentially free of pigments, dyes, and inorganic filler materials.

The composition of the invention is very suitable as a dispersing agent for colorants and fulfills the above-mentioned needs. The composition is a non-pigmented composition, which means that the composition is essentially free of particles, which impart color or opaqueness to the composition, such as pigments, dyes, and inorganic filler materials.

The first block of the block co-polymer comprises repeating units 1 as described above. According to the invention, the first block comprises 1 or more different types of repeating units 1. Generally, first block comprises 1 to 12 different types of repeating units 1. The repeating units 1 in the block co-polymer are generally derived by polymerization of suitable ethylenically unsaturated polymerizable monomers.

The ethylenically unsaturated monomers that form the repeating unit 1 in the block co-polymer are generally selected from acrylic esters, methacrylic esters, acrylamides and/or methacrylamides which preferably carry no primary, secondary, tertiary or quaternized amino group. Herein the term "(meth)acryl" refers to both methacryl and acryl. The same applies for the term "(meth)acrylate" which refers to both methacrylate and acrylate, likewise.

Examples for Such Monomers are (i) (meth)acrylic esters of straight-chain, branched or cycloaliphatic alcohols having 1 to 22, preferably 1 to 12, more preferably 1 to 8 and most preferably 1 to 6 carbon atoms, such as methyl (meth)acrylate, ethyl (meth)acrylate, n-butyl (meth)acrylate, tert-butyl (meth)acrylate, n-hexyl (meth)acrylate, isobutyl (meth)acrylate, isopentyl (meth)acrylate, lauryl (meth)acrylate, 2-ethylhexyl (meth)acrylate, stearyl (meth)acrylate, cyclohexyl (meth)acrylate, behenyl (meth)acrylate, isodecyl (meth)acrylate, 2-propylheptyl (meth)acrylate, 3,5,5-trimethyl-1-hexyl (meth)acrylate, nonanyl (meth)acrylate, 2-propylheptyl (meth)acrylate, 2-isopropyl-5-methyl-hexyl (meth)acrylate, tridecyl (meth)acrylate, heptadecyl (meth)acrylate, heneicosanyl (meth)

acrylate and isobornyl (meth)acrylate; and (meth)acrylic ester having dicyclopentadienyl functionality, such as dicyclopentenyl oxyethyl acrylate or methacrylate.

(ii) aryl (meth)acrylic esters whose aryl ring, without possible additional substituents, contains 5 to 12, preferably 6 to 10, carbon atoms, such as phenyl acrylate; and aralkyl (meth)acrylic esters whose aralkyl radical, without possible additional substituents on the aryl radical, contains 6 to 11, preferably 7 to 11, carbon atoms, such as benzyl methacrylate, it being possible for the aryl radicals of the aryl (meth)acrylic esters and of the aralkyl (meth)acrylic esters in each case to be unsubstituted or to be substituted up to four times, such as, for example, 4-methylphenyl methacrylate; and (iii) (meth)acrylic acid esters of monoether monoalcohols or polyether monoalcohols, such as ethers, polyethylene glycols, polypropylene glycols, polybutylene glycols or mixed polyalkylene glycols having 4 to 80 carbon atoms and a statistical, a block or a gradient distribution of the different monomers along the chain, such as, for example, tetrahydrofurfuryl (meth)acrylate, di(ethylene glycol) methyl ether (meth)acrylate, furfuryl (meth)acrylate, 2-butoxyethyl (meth)acrylate, 2-ethoxyethyl (meth)acrylate, allyloxyethyl (meth)acrylate, 1-ethoxybutyl (meth)acrylate, methyltriglycol (meth)acrylate, ethyltriglycol (meth)acrylate, butyldiglycol (meth)acrylate, poly(propylene glycol) methyl ether (meth)acrylate and poly(ethylene glycol) alkyl ether (meth)acrylate, wherein alkyl stands for a straight-chain or branched alkyl residue having 1 to 22, preferably 1 to 15, more preferably 1 to 12, even more preferably 1 to 8 carbon atoms and most preferable 1 to 4 carbon atoms; and (iv) trimethylsilyl(meth)acrylate.

Preferred are esters of methacrylic acid, rather than esters of acrylic acid. More preferably $R^2$ in repeating unit 1 stands for a branched or unbranched alkyl residue with 1 to 12, preferably 1 to 10 carbon atoms, a cycloalkyl residue with 4 to 8, preferably 6 carbon atoms, an araliphatic residue with 7 to 12 carbon atoms, like benzyl; and trimethylsilyl.

Highly preferred are methyl and butyl methacrylate, cyclohexyl methacrylate, isobornyl methacrylate and polyalkylene oxide methacrylates.

In a preferred embodiment, the first block comprises at least one type of repeating unit comprising ether groups. It should be understood that ether groups generally relate to non-cyclic ether groups.

Such repeating units are suitably provided by monomers of the following formula (I)

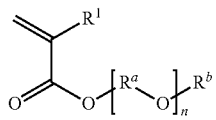
(I)

wherein
$R^1$ represents H or $CH_3$,
$R^a$ represents a linear or branched alkylene group with 2 to 6 carbon atoms,
$R^b$ represents aralkyl, preferably benzyl; or alkyl with 1 to 8 carbon atoms, preferably methyl, ethyl, propyl or butyl; and
n represents an integer from 1 to 150, preferably 1 to 50, more preferably 1 to 25, and in case at least two different types of residue $R^a$ present the n $[R^aO]$ units, the $[R^aO]_n$ chain may have a random, block or gradient architecture along the chain.

In a further embodiment, the first block comprises repeating units derived from monomers selected from ethyl triglycol methacrylate, methyl triglycol methacrylate, butyl diglycol methacrylate, and mixtures thereof.

Repeating Unit 2

The second block of the co-polymer comprises repeating units 2 having a tertiary amino group. Repeating units 2 can be generated by polymerization of acrylic esters, methacrylic esters, acrylamides and methacrylamides which have at least one tertiary amino group. The monomers are preferably selected from the group of tert-aminoalkyl (meth)acrylic esters having 2 to 12, preferably 2 to 8 carbon atoms in the tert-aminoalkyl group, including possible additional substituents, like further additional tert-amino groups in residues $R^4$ and $R^5$. Examples for repeating unit 2 are N,N-dimethylaminoethyl (meth)acrylate, N,N-diethylaminoethyl (meth)acrylate, N,N-dibutylaminoethyl (meth)acrylate, 2-(2-dimethylaminoethyl(methyl)amino]ethyl (meth)acrylate, 2-(2-dimethylaminoethyloxy)ethyl (meth)acrylate, 2-morpholinoethyl (meth)acrylate, 2-(1-piperidyl)ethyl (meth)acrylate, 2-(N-ethylanilino)ethyl (meth)acrylate, 2-imidazol-1-ylethyl (meth)acrylate and N,N-dimethylaminopropyl (meth)acrylate. Most preferred is the use of N,N-dimethylaminoethyl-methacrylat (DMAEMA).

Repeating units 2 containing at least one tertiary amino group can also be produced by reactions after the construction of the polymer chain. By way of example, oxiran-containing ethylenically unsaturated monomers such as glycidyl methacrylate can be (co)polymerized to form a polymeric block having oxirane groups.

They can be reacted with amines after the polymerization. In such case residue $R^3$ will contain a hydroxyl group. If desired, $R^4$ and/or $R^5$ may contain further hydroxyl groups. Suitable for this purpose are primary amines which additionally carry one or more tertiary amino groups or secondary amines, which optionally additionally carry one or more tertiary amino groups. Examples include dimethylaminopropylamine and diethylaminoethylamine; dialkylamines such as diethylamine, dibutylamine and dicyclohexylamine; secondary amines having two different substituents such as, for example, N-(2-hydroxyethyl)aniline; secondary amines which additionally carry one or more tertiary amino groups, such as bis(3-dimethylaminopropyl)amine; dihydroxyalkylamines, such as diethanolamine and diisopropanolamine. Preference is given to secondary amines which, optionally, additionally carry one or more tertiary amino groups.

In a further embodiment, the second block further comprises repeating units 3

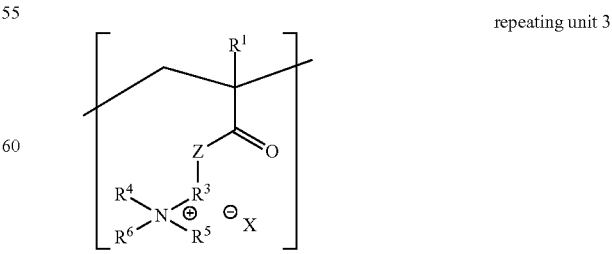
repeating unit 3 wherein $R^6$ represents an organic group and $X^-$ represents an anion.

Repeating units 3 can be described as reaction product of a quaternization reaction of the tertiary amine group of repeating units 2. In one embodiment, quaternization is carried out after formation of the polymer. Alternatively, quaternization may be carried out on the corresponding unsaturated monomers prior to polymerization.

Thus, repeating units 3 can be introduced by partial quaternization of the amine groups of repeating units 2.

Suitable quaternization agents may be selected from alkyl halides and aralkyl halides, or epoxides, for example glycidyl ethers in the presence of acids. Typically, alkyl halides and aralkyl halides like benzyl chloride, 2- or 4-vinylbenzylchloride, methyl chloride or methyl iodide can be used. Moreover, tosylates like methyl tosylate can be used. Examples of suitable glycidyl ethers are alkyl glycidyl ethers like 2-ethylhexyl glycidyl ether and $C_{13}/C_{15}$-alkyl glycidyl ether or aryl glycidyl ethers like cresylglycidyl ether as well as glycidyl methacrylate. Examples for acids used in this quaternization reaction are carboxylic acids like benzoic acid, acetic acid or lactic acid. Further acids are phosphoric acid ester with one or two ester substituents. Preferred are benzyl chloride, 4-vinylbenzyl chloride and glycidyl methacrylate in combination with a carboxylic acid.

In a further embodiment, quaternization is carried out with a quaternization agent of formula (II)

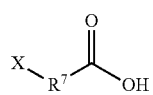

(II)

wherein X is a so-called leaving group, like halide, triflate or tosylate that can undergo a nucleophilic substitution reaction with a tertiary amine group; and $R^7$ is a linear or branched hydrocarbon group with 1 to 8 carbon atoms.

Preferred compounds of general formula (II) are monochloroacetic acid, derivatives of lactic acid, such as tosylated lactic acid, monochloropropionic acid, and higher homologous carboxylic acids substituted with a leaving group.

One or more types of quaternization agents may be used, either simultaneously or subsequently.

The conversion of repeating units 2 via quaternization can be determined by the amine value of the polymer by DIN 16945.

Generally, the block co-polymer has an amine value in the range of 1 to 250 mg KOH/g. In preferred embodiments, the amine value of the block copolymer is in the range of 30 to 180 mg KOH/g, more preferred 50 to 160 mg KOH/g, and most preferred 80 to 130 mg KOH/g.

In one embodiment, the block co-polymer consists of or essentially consists of the first block and the second block, which have been described above. In a further embodiment, the block co-polymer comprises a third block, which may or may not be different from the first block and the second block. The third block may be connected to the first block or the second block as a terminal block of the co-polymer. In one embodiment, the third block is located between the first block and the second block. In this case, the third block may consist of a combination of the repeating units of the first block and the second block.

In a further embodiment, the second block comprising repeating units 2 is located between the first block and the third block. In this embodiment, the first block and the third block have the same type of repeating units 1, i.e. the first block and the third block are based on the same type of monomers. Alternatively, the first block and the third block have different types of repeating units 1, i.e. the first block and the third block are based on different types of monomers. In this case, the third block comprises repeating units 1 wherein $R^2$ comprises polyether groups, whereas the first block comprises repeating units 1 wherein $R^2$ is essentially free of polyether groups.

In a further embodiment, the block co-polymer comprises at least three blocks, wherein the first block is located between the second block and a third block, and wherein the third block comprises the same type of repeating units 2 as the second block.

In a still further embodiment, the third block of the block co-polymer comprises different types of repeating units 1 than the first block, and the third block is located between first block and the second block.

In typical embodiments of the block co-polymer, the weight ratio of the first block and the second block is in the range of 90:10 to 25:75. In preferred embodiments, the weight ratio of the first block and the second block is in the range of 80:20 to 40:60.

For block co-polymers comprising three blocks, the first block suitably contributes 5 to 80% by weight, preferably 5 to 75% by weight to the total weight of the block co-polymer. For block co-polymers comprising three blocks, the second block suitably contributes 10 to 75% by weight, preferably 20 to 60% by weight to the total weight of the block co-polymer. For block co-polymers comprising three blocks, the third block suitably contributes 5 to 80% by weight, preferably 5 to 75% by weight to the total weight of the block co-polymer.

A preferred block co-polymer of the invention is a block co-polymer preferably having a number-average molecular weight $M_n$ of 2000 to 20000 g/mol, more preferably of 3000 to 17000 g/mol and most preferably of 4000 to 14000 g/mol. The number-average molecular weight $M_n$ and the weight-average molecular weight $M_w$ are determined in accordance with DIN 55672-1:2007-08 by means of gel permeation chromatography using tetrahydrofuran containing 1% by volume of dibutylamine as eluent and polystyrene as standard. If the number-average molecular weight is too high, the viscosity may deteriorate.

The block co-polymer of the invention generally has a low polydispersity. Polydispersity is the weight average molecular weight $M_w$ divided by the number average molecular weight $M_n$. Preferably, the polydispersity of the block co-polymer is in the range of 1.03 to 1.80, more preferably 1.05 to 1.40.

The composition of the invention further comprises a polymer b) comprising at least one acidic group, and having a number average molecular weight of 300 g/mol or higher.

A polymer comprises at least three repeating units of polymerized monomers. Generally, the molecular weight of the polymer b) is in the range of 300 to 20000 g/mol, preferably 300 to 15000 g/mol, and more preferably 400 to 2000 g/mol.

The at least one acidic group in polymer b) is generally selected from carboxylic acid groups, acidic groups containing phosphorus, and sulfonic acid groups. Examples of acidic groups containing phosphorus include phosphonic acid groups, and mono- and diesters of phosphoric acid.

Individual polymer molecules of polymer b) may contain 1, 2 or more acidic groups per molecule. It is preferred that the molecules contain 1 or 2 acidic groups per molecule. The number of acidic groups per molecule can also be expressed as average functionality, i.e. the number of acid groups in a sample divided by the number of molecules in a sample. Preferably, the average functionality is in the range of 0.9 to 1.2 acidic groups per molecule.

Polymer b) may be a linear or branched polymer. Preferably, polymer b) is an essentially linear polymer. Polymer b) may be based on one or more types of monomers. In some embodiments, polymer b) comprises ester groups. Polymer b) may be a polyester, for example a polyester based on dicarboxylic acids, diols, and optionally monoalcohols, monocarboxylic acids, and combinations thereof. If branched polyesters are desired, it is possible to include ester forming building blocks having three or more ester-forming functional groups. Alternatively, polymers containing ester groups can be prepared by ring-opening polymerization of lactones. Examples of suitable lactones include epsilon-caprolactone and delta-valerolactone.

In further embodiments, polymer b) comprises ether groups. Polymer b) may be a polyether, for example a polyether prepared by ring opening polymerization of cyclic ether groups, such as epoxides and oxetanes. Examples of suitable epoxides include ethylene oxide, propylene oxide, glydicylethers, glycidylesters, and mixtures thereof. Suitable oxetanes include unsubstituted oxetane or a substituted oxetane, such as trimethylolpropaneoxetane. Polymerization of hydroxyl-functional cyclic ethers may lead to branched polyether structures.

In a further embodiment, polymer b) comprises ester groups and ether groups. In one embodiment, polymer b) may be a block copolymer comprising at least one polyether block and at least one polyester block. Alternatively, ester groups and ether groups may be distributed randomly in polymer b).

The acidic groups may be introduced in polymer b) by well-known methods.

Acidic phosphoric acid esters are suitably prepared by reacting one phosphoric acid equivalent of an ester-forming phosphorus compound with one to two equivalents of a hydroxyl-functional polymer.

This reaction is described, for example, in Houben-Weyl, "Methoden der Organischen Chemie," Vol. XII/2, 4th ed., pp. 143 ff.

If one equivalent of a mono hydroxyl functional polymer is used for each phosphoric acid equivalent of an ester-forming phosphorus compound, monoesters form. If two equivalents are used, diesters are formed. If between one and two equivalents are used, a mixture of monoesters and diesters is formed.

As used herein, the term "ester-forming phosphorus compound" is understood to refer to a phosphorus compound which can form a phosphoric acid ester by reaction with a hydroxy compound. For example, phosphorus oxychloride, phosphorus pentoxide, polyphosphoric acid and acetyl phosphate can be used as ester-forming phosphorus compounds. Additional examples are given in German Patent Application No. DE-A 2,726,854. Phosphorus pentoxide and polyphosphoric acid are preferred.

The reaction of the aforementioned ester-forming phosphorus compounds with the hydroxy compounds is preferably carried out without a solvent, at temperatures up to about 100° C. However, the reaction can also be carried out in the presence of suitable inert solvents, as described, for example, in European Patent Application EP 0193019 A.

Polymers having carboxylic acid groups are suitably prepared by reacting a hydroxyl functional or primary or secondary amine functional polymer with a cyclic carboxylic anhydride. Examples of suitable cyclic carboxylic anhydrides include maleic anhydride, itaconic anhydride, citraconic anhydride, succinic anhydride, and phthalic anhydride. Alternatively, the ring-opening polymerization of lactones may be started with a carboxylic acid to yield a carboxylic acid functional polyester.

Polymers having sulfonic acid groups may be prepared by treatment of polymers having alkyl groups with sulfur dioxide and oxygen in the presence of radical forming agents, by oxidation of thiol functional polymers, or by treatment of halide functional polymers with sodium sulfate and subsequent acidification.

The composition of the invention may suitably be formed by combining the block co-polymer a) and polymer b), and mixing the two components. The polymers a) and b) may suitably be provided as solutions in one or more organic solvents to reduce the viscosity and to facilitate handling and mixing. It is believed that salt formation between repeating units 2 of polymer a) and the acidic groups of polymer b) leads to improved properties of the composition. Salt formation is believed to be facilitated by keeping the composition at ambient temperature or at elevated temperature for certain period of time. In exemplary embodiments, the composition is kept, after mixing, at a temperature in the range of 20 to 80° C. for a period of 20 minutes to 24 hours to equilibrate salt formation.

The mixing ratio of polymer a) and polymer b) is not particularly critical. Generally, the mixing ratio is chosen to arrive at a molar ratio of repeating units 2 of the block co-polymer of component a) and acidic groups of component b) in the range of 1.00:0.05 to 1.00:1.40, preferably 1.00:0.20 to 1.00:1.25.

The invention also relates to the use of the composition as dispersing agent for colorants. Suitable colorants include pigments, and dyes, opaqueness providing fillers, and combinations thereof.

Examples of suitable colorants are described in international patent application PCT/EP2018/081346, page 9, line 30 to page 13, line 16, and JP 6248838 B, Page 6, line 32 to page 9, line 33. In addition, Pigment Red-291, Pigment Yellow-231, and Pigment Green-62 or 63 may be mentioned as a very suitable colorant.

The invention also relates to a process of preparing a colored composition comprising the steps of
  a) providing a composition comprising a) a block co-polymer and b) a polymer comprising at least one acidic group in accordance with the invention,
  b) adding one or more color imparting pigments or dyes to the composition, and
  c) dispersing the one or more pigments or dyes in the composition to form a colored composition.

If so desired, further components may be included in the colored composition. Examples of further components include film-forming binders, other resins and polymers, reactive diluents and solvents, curing catalysts, as well as further additives. The choice of further components depends on the intended use of the colored composition. In exemplary embodiments, the colored composition is formulated as an inkjet ink composition, as an automotive basecoat composition, or as a composition for color filters, in particular color filters for flat panel displays. When the colored composition is formulated as a color filter composition, it is preferred that an alkali-soluble resin is included in the composition. Examples of suitable alkali-soluble resins are described in international patent application PCT/EP2018/081346, page 14, line 20 to page 15, line 21, and JP 6248838 B, Page 11, line 20 to page 13, line 6.

Compositions for color filters for flat panel displays preferably also comprise an ethylenically unsaturated component having one or more ethylenically unsaturated groups. Examples of such components are described in international patent application PCT/EP2018/081346, page 15, line 23 to page 16, line 33.

EXAMPLES

Raw Materials Used
MMA: Methyl methacrylate (Evonik)
BMA: n-Butyl methacrylate (Evonik)
BzMA: Benzyl methacrylate (Evonik)
EHMA: 2-Ethylhexyl methacrylate (Evonik)
IBOMA: Isobornyl methacrylate (Evonik)
BDGMA: Butyldiglycol methacrylate (Evonik)
MPEG-1000MA: Methoxy polyglycol (number of ethyleneoxide unit: 23) methacrylate (Shin-Nakamura Chemical)
DMAEMA: N,N-Dimethylaminoethyl methacrylate (Evonik)
MMTP: 1-Methoxy-1-(trimethylsiloxy)-2-methylpropene (Sigma-Aldrich)
Catalyst: Tetrabutylammonium 3-chlorobenzoate, 50% strength in acetonitrile, see U.S. Pat. No. 4,588,795
AMBN: 2,2'-Azodi(2-methylbutyronitrile) (Akzo Nobel)
PMA: 1-Methoxy-2-propyl acetate (DOW Chemicals)
PM: 1-Methoxy-2-propylalcohol (DOW Chemicals)
BzCl: Benzyl chloride (Sigma-Aldrich)
Grilonit RV 1814: Alkyl (number of carbon: 13-15) glycidyl ether (EMS-GRILTECH)
CGE: o-Cresylglycidylether (Sigma-Aldrich)
Benzoic acid: (Sigma-Aldrich), theoretical molecular weight=122.12
Lutensol AO11: C13-C15 Alkoxylated polyethyleneglycol (number of ethyleneoxide unit: 11) (BASF)
MPEG-350: Methoxy polyethylene glycol (number of ethyleneoxide unit: 8)
ε-Caprolactone: (Sigma-Aldrich)
δ-Valerolactone: (Sigma-Aldrich)
PPA: Polyphosphoric acid (Sigma-Aldrich)
Succinic anhydride: (Sigma-Aldrich)
Maleic anhydride: (Sigma-Aldrich)
KOH: Potassium hydroxide (Sigma-Aldrich)
DBSA: Dodecylbenzenesulfonic acid (Sigma-Aldrich)
Phosmer M: (2-Methacryloyloxy)ethyl phosphate (Uni-Chemical), theoretical molecular weight=210.12
Dibutylamine (Sigma-Aldrich)
General Methods
1-Methoxy-2-propyl acetate and all monomers were stored over 3 A molecular sieve for 48 hours before use.
Gel Permeation Chromatography (GPC)
Number-average Mn and weight-average Mw molecular weights and the molecular weight distribution were determined according to DIN 55672-1:2007-08 at 40° C. using a high-pressure liquid chromatography pump (WATERS 600 HPLC pump) and a refractive index detector (Waters 410). As separating columns, a combination was used of 3 Styragel columns from WATERS with a size of 300 mm×7.8 mm ID/column, a particle size of 5 μm, and pore sizes HR4, HR2 and HR1. The eluent used was tetrahydrofuran with 1% by volume of dibutylamine, with an elution rate of 1 mL/min. The conventional calibration was carried out using polystyrene standards.
Measurement of Non-Volatile Content (Solids Content)
The sample (2.0±0.2 g of the tested substance) was weighed accurately into a previously dried aluminum dish and dried for 20 minutes at 150° C. in the varnish drying cabinet, cooled in a desiccator and then reweighed. The residue corresponds to the solids content in the sample (ISO 3251).
Measurement of the Amine Value
1.5 to 3.0 g of a sample was precisely weighed out into a 80 mL beaker and is dissolved with 50 mL of acetic acid. Using an automatic titration device provided with a pH electrode, this solution was neutralization-titrated with a 0.1 mol/L $HClO_4$ acetic acid solution. A flexion point of a titration pH curve was used as a titration endpoint, and an amine value was obtained by the following equation.

$$\text{Amine value [mg KOH/g]}=(561\times 0.1\times f\times V)/(W\times S)$$

(wherein f: factor of titration agent, V: titration amount at titration endpoint [mL], W: weighed amount of sample [g], S: solid matter concentration of sample [wt %])
Measurement of the Acid Value
1.5 to 3.0 g of a sample was precisely weighed out into a 80 mL beaker and is dissolved with 50 mL of ethanol. Using an automatic titration device provided with a pH electrode, this solution was neutralization-titrated with a 0.1 mol/L ethanolic KOH solution. A flexion point of a titration pH curve was used as a titration endpoint, and an amine value was obtained by the following equation.

$$\text{Acid value [mg KOH/g]}=(561\times 0.1\times f\times V)/(W\times S)$$

(wherein f: factor of titration agent, V: titration amount at titration endpoint [mL], W: weighed amount of sample [g], S: solid matter concentration of sample [wt %])
Preparation of Polymers
Synthesis of Diblock Copolymer DB-1
58.9 g of dried 1-methoxy-2-propyl acetate (PMA) was placed into a water-free reaction vessel. 36.3 g of monomer mixture 1 was added dropwise over 60 minutes. Immediately after the start of the metering, the respective amount of initiator and catalyst were introduced into the reaction vessel. Throughout the reaction, the reaction temperature was kept at 20° C. After the end of the metering of monomer mixture 1, 3.6 g of monomer 2 was added dropwise over 30 minutes. The subsequent reaction time after the end of the metering of monomer 2 was 60 minutes. Afterwards 1.1 g of 1-methoxy-2-propanol (PM) was added in order to stop the reaction. Analytical results of diblock copolymer DB-1 are described in Table 1.
Synthesis of Diblock Copolymer DB-2-DB-6
Diblock copolymer DB-2-DB-6 were synthesized using the same procedure as used for block copolymer DB-1, except using different monomer mixture 1 and monomer mixture 2 (Details are described in Table 1).
Synthesis of Random Copolymer RC-1
41.0 g of PMA was placed into a reaction vessel and the reactor vessel was heated up to 120° C. Then, 40.0 g of monomer mixture 1 and 13.5 g of initiator solution (3.5 g of AMBN was dissolved in 10.0 g of PMA) were separately added dropwise to the reaction vessel over 3 hours. After the addition of monomer mixture 1 and initiator solution was finished, the reactor vessel was kept at 120° C. for 1 hour under stirring. After that, 5.5 g of initiator solution (0.5 g of AMBN was dissolved in 5.0 g of PMA) was added into the reactor vessel, and the he subsequent reaction time after adding the initiator solution was 60 minutes.
Analytical results of random copolymer RC-1 are described in Table 1.
Synthesis of Triblock Copolymer TB-1
36.8 g of dried PMA was placed into a water-free reaction vessel. 24.1 g of monomer mixture 1 was added dropwise for 30 minutes. Immediately after the start of the metering, the respective amount of initiator and catalyst were introduced into the reaction vessel. Throughout the reaction, the reaction temperature was kept at 20° C. After the end of the metering of monomer mixture 1, 11.8 g of monomer 2 was added dropwise for 30 minutes. After the end of the metering of monomer mixture 2, 24.1 g of monomer 3 was added dropwise for 30 minutes. The subsequent reaction time after the end of the metering of monomer 3 was 60 minutes. Afterwards 1.6 g of PM was added in order to stop the reaction.

Analytical results of triblock copolymer TB-1 are described in Table 2.

Synthesis of Triblock Copolymer TB-2

Triblock copolymer TB-2 was synthesized using the same procedure as used for triblock copolymer TB-1, except using different dosages and/or compositions of monomer mixture 1, monomer mixture 2 and monomer mixture 3 (Details are described in Table 2).

Synthesis of Quaternized Diblock Copolymer QB-1

58.4 g of diblock copolymer DB-6, 7.6 g of PMA, 29.0 g of PM and 5.0 g of benzyl chloride were placed into a reaction vessel, and the reactor vessel was heated up to 120° C. The quaternization reaction was carried out at 120° C. for 4 hours. An overview of quaternized diblock copolymers is provided in Table 3.

Synthesis of Quaternized Diblock Copolymer QB-2

54.2 g of diblock copolymer DB-6, 37.4 g of PMA and 2.5 g of benzoic acid were placed into a reaction vessel, and the reactor vessel was heated up to 120° C. Then, 5.9 g of Grilonit RV 1814 was added to the reaction vessel. The quaternization reaction was carried out at 120° C. for 4 hours.

Synthesis of Quaternized Diblock Copolymer QB-3

Quaternized diblock copolymer QB-3 was synthesized using the same procedure as used for quaternized diblock copolymer QB-2, except using a different quaternization agent, different dosages of quaternization agent and PMA (Details are described in Table 3).

Synthesis of Quaternized Random Copolymer QR-1

Quaternized random copolymer QR-1 was synthesized using the same procedure as used for quaternized diblock copolymer QB-1.

Synthesis of Acidic Polymer AP-1

0.3 g of potassium hydroxide, 77.5 of methoxypolyethyleneglycol (number of polyethylene oxide unit=13) and succinic anhydride were placed into a reaction vessel, and the reaction vessel was heated up to 80° C. Synthesis of acidic polymer AP-1 was carried out at 80° C. for 1 hour. An overview of acidic polymers is provided in Table 4.

Synthesis of Acidic Polymer AP-2

86.0 g of Lutensol AO11 was placed into a reaction vessel, and the reaction vessel was heated up to 50° C. Then, 14.0 g of polyphosphoric acid (PPA) was added to the reaction vessel dropwise, and the reactor vessel was heated up to 80° C. Synthesis of acidic polymer AP-2 was carried out at 80° C. for 1 hour.

Synthesis of Acidic Polymer AP-3-AP-4

Acidic polymer AP-3 and AP-4 were synthesized using the same procedure as used for acidic polymer AP-1, except using different dosages and/or compositions of catalysts, alcohols, caprolactones and acidic parts (Details are described in Table 4).

Synthesis of Acidic Polymer AP-5

0.10 g of dodecylbenzenesulfonic acid (DBSA), 44.9 g of MPEG-350, 28.2 g of E-caprolactone and 16.5 g of 6-valerolactone were placed into a reaction vessel, and the reaction vessel was heated up to 80° C. The reaction was carried out at 80° C. for 1 hour. After that, 10.3 g of PPA were placed to the reaction vessel. Synthesis of acidic polymer AP-5 was carried out at 80° C. for 1 hour.

Synthesis of Neutralization Product S-1

89.2 g of aminic diblock copolymer DB-1, 4.3 g of acidic polymer AP-1 and 6.5 g of PMA were placed into a reaction vessel, and the reaction vessel was heated up to 80° C. Neutralization reaction was carried out at 80° C. for 1 hour. An overview of neutralization products is provided in Table 5.

Synthesis of Neutralization Product S-2, S-5-S-16

Neutralization product S-2-S-16 were synthesized using the same procedure as used for neutralization product S-1, except using different aminic block copolymer and acidic polymer, different molar ratio of amine to acid and different dosage of PMA (Details are described in Table 5).

Synthesis of Neutralization Product S-3, S-4 and NS-1

Neutralization product S-3, S-4 and NS-11 were synthesized using the same procedure as used for neutralization product S-1, except using different aminic block copolymer and acidic polymer, different molar ratio of amine to acid and different dosage of PMA (Details are described in Table 5). After neutralization process, a distillation of PMA from the reactor was carried out at 150° C. under reduced pressure. After that, 60 g of ionized water was added to the reactor to dissolve neutralization product in water. Analytical results of neutralization product S-3, S-4 and NS-1 are described in Table 5.

Synthesis of Alkali-Soluble Resin R1:

300 g of PMA was placed into a reaction vessel. 137 g of BzMA, 34 g of methacrylic acid and 1.65 g of AMBN were metered in at a temperature of 120° C. over 180 minutes. The subsequent reaction time after the end of the metering was 120 minutes. The solids content was then adjusted to 35 wt.-% with PMA (DIN EN ISO 3251:2008-06 at 150° C. for 20 min).

TABLE 1

Recipes of diblock copolymer DB-1 - DB-6 and random copolymer RC-1

| Product name | Initiator/ Catalyst [weight-%] | Monomer mixture 1 [weight-%] | | | | | | | Monomer mixture 2 [weight-%] | | | |
|---|---|---|---|---|---|---|---|---|---|---|---|---|
| | | MMA | BMA | EHMA | BzMA | IBOMA | BDGMA | MPEG-1000MA | DMAEMA | DMAEMA | MMA | BzMA |
| DB-1 | 1.10/0.04 | 21.8 | | 3.6 | 7.3 | 3.7 | | | | 3.6 | | |
| DB-2 | 1.10/0.04 | 17.3 | | | 4.3 | | | | | 18.4 | | |
| DB-3 | 1.10/0.04 | 17.2 | 3.4 | | | 10.3 | | | | 5.0 | 0.3 | 0.3 |
| DB-4 | 1.10/0.04 | 16.0 | | | | | 16.0 | | | 8.0 | | |
| DB-5 | 1.58/0.06 | 19.3 | 4.8 | | | 24.1 | | | | 11.8 | | |

TABLE 1-continued

Recipes of diblock copolymer DB-1 - DB-6 and random copolymer RC-1

| | | | | | | | | | |
|---|---|---|---|---|---|---|---|---|---|
| DB-6 | 1.58/0.06 | 16.0 | 8.0 | 8.0 | 4.0 | 4.0 | | 20.0 | |
| RC-1* | 4.00/— | 16.0 | 8.0 | 8.0 | 4.0 | 4.0 | 20.0 | | |

| Product name | Amine Value of Polymers [mg KOH g$^{-1}$] | $M_n$ [g/mol] | $M_w/M_n$ [g/mol] | Solids content [weight-%] |
|---|---|---|---|---|
| DB-1 | 30 | 6912 | 1.17 | 40 |
| DB-2 | 160 | 6524 | 1.16 | 40 |
| DB-3 | 47 | 6903 | 1.15 | 40 |
| DB-4 | 70 | 8539 | 1.24 | 40 |
| DB-5 | 70 | 6630 | 1.18 | 60 |
| DB-6 | 120 | 6438 | 1.15 | 60 |
| RC-1* | 120 | 3874 | 2.12 | 40 |

Comparative Examples are marked in all TABLEs by *

TABLE 2

Recipes of triblock copolymer TB-1-TB-4

| Product name | Initiator/ Catalyst [weight-%] | Monomer mixture 1 [weight-%] | | | Monomer mixture 2 [weight-%] | | | |
|---|---|---|---|---|---|---|---|---|
| | | MMA | BMA | BDGMA | DMAEMA | MMA | BMA | BDGMA |
| TB-1 | 1.58/0.06 | 9.7 | 2.4 | 12.0 | 11.8 | | | |
| TB-2 | 1.58/0.06 | 19.3 | 4.8 | | 11.8 | | | |

| Product name | Monomer mixture 3 [weight-%] | | | | Amine Value of Polymers [mg KOH g$^{-1}$] | $M_n$ [g/mol] | $M_w/M_n$ [g/mol] | Solids content [weight-%] |
|---|---|---|---|---|---|---|---|---|
| | DMAEMA | MMA | BMA | BDGMA | | | | |
| TB-1 | 9.7 | 2.4 | | 12.0 | 70 | 6432 | 1.26 | 60 |
| TB-2 | | | | 24.1 | 70 | 6275 | 1.28 | 60 |

TABLE 3

Recipes of quaternized diblock copolymer QB-1-QB-3 and quaternized random copolymer QR-1

| Product name | Intermediate polymer | | Quaternization agent [weight-%] | | | Solvent [weight-%] | | Quaternization degree [mol-%] | Solids content [weight-%] |
|---|---|---|---|---|---|---|---|---|---|
| | Name | Amount [weight-%] | Grilonit RV 1814/ BzCl | CGE/ Benzoic acid | Benzoic acid | PMA | PM | | |
| QB-1 | DB-6 | 58.4 | 5.0 | | | 7.6 | 29.0 | 30 | 40 |
| QB-2 | DB-6 | 54.2 | | 5.9/2.5 | | 37.4 | | 30 | 40 |
| QB-3 | DB-6 | 57.8 | | | 3.6/2.7 | 35.9 | | 30 | 40 |
| QR-1* | RC-1 | 58.4 | 5.0 | | | 7.6 | 29.0 | 30 | 40 |

TABLE 4

Recipes of acidic polymer AP-1-AP-5

| Product name | Catalyst [weight-%] | | Alcohol [weight-%] | | Caprolactone [weight-%] | | Acidic part [weight-%] | | | Solids content [weight-%] | Molecular weight (theoretical) [g/mol] | Acid Value of Polymers [mg KOH g$^{-1}$] |
|---|---|---|---|---|---|---|---|---|---|---|---|---|
| | KOH | DBSA | Lutensol AO11 | MPEG-350 | ε-Capro lactone | δ-Valero lactone | Succinic anhydride | Maleic anhydride | PPA | | | |
| AP-1 | 0.30 | | | 77.5 | | | 22.2 | | | 100 | 450 | 124 |
| AP-2 | | | 86.0 | | | | | | 14.0 | 100 | 772 | 186 |
| AP-3 | 0.30 | | | 77.9 | | | | 21.8 | | 100 | 448 | 125 |
| AP-4 | 0.30 | 0.10 | | 43.7 | 27.4 | 16.1 | 12.4 | | | 100 | 780 | 70 |
| AP-5 | | 0.10 | | 44.9 | 28.2 | 16.5 | | | 10.3 | 95 | 875 | 129 |

TABLE 5

Recipes of neutralization product S-1 - S-16, and non-neutralized product NS-1

| Product name | Aminic block copolymer Name | Amount [weight-%] | Acidic component Name | Amount [weight-%] | Solvent [weight-%] PMA | Water | Neutralization degree [mol-%] | Solids content [weight-%] | Amine Value of Polymers [mg KOH g⁻¹] | Acid Value of Polymers [mg KOH g⁻¹] |
|---|---|---|---|---|---|---|---|---|---|---|
| S-1  | DB-1 | 89.2  | AP-1         | 4.3  | 6.5  |      | 50  | 40 | 11 | 5  |
| S-2  | DB-2 | 22.1  | AP-5         | 22.1 | 33.2 |      | 100 | 40 | 71 | 71 |
| S-3  | DB-4 | 72.7  | AP-2         | 10.9 |      | 60.0 | 100 | 40 | 20 | 20 |
| S-4  | DB-4 | 64.8  | AP-5         | 14.1 |      | 60.0 | 100 | 40 | 18 | 18 |
| S-5  | DB-3 | 66.5  | AP-4         | 13.4 | 20.1 |      | 75  | 40 | 13 | 9  |
| S-6  | DB-5 | 43.2  | AP-5         | 14.1 | 42.7 |      | 100 | 40 | 45 | 45 |
| S-7  | TB-1 | 43.2  | AP-5         | 14.1 | 42.7 |      | 100 | 40 | 45 | 45 |
| S-8  | TB-2 | 43.2  | AP-5         | 14.1 | 42.7 |      | 100 | 40 | 45 | 45 |
| S-9  | QB-1 | 83.4  | AP-2         | 6.6  | 10.0 |      | 50  | 40 | 25 | 12 |
| S-10 | QB-2 | 87.5  | AP-5         | 5.0  | 7.5  |      | 25  | 40 | 34 | 17 |
| S-11 | QB-3 | 78.7  | AP-5         | 8.5  | 12.8 |      | 50  | 40 | 33 | 21 |
| S-12* | RC-1 | 51.0 | AP-3         | 19.6 | 29.4 |      | 100 | 40 | 24 | 24 |
| S-13* | QR-1 | 77.0 | AP-1         | 9.2  | 13.8 |      | 50  | 40 | 23 | 11 |
| S-14* | DB-6 | 59.7 | Phosmer M    | 16.1 | 24.2 |      | 100 | 40 | 43 | 43 |
| S-15* | DB-3 | 71.8 | Benzoic acid | 11.3 | 16.9 |      | 100 | 40 | 52 | 52 |
| S-16* | QB-1 | 87.8 | Phosmer M    | 4.9  | 7.3  |      | 50  | 40 | 26 | 13 |
| NS-1* | DB-4 | 100.0 |             |      |      | 60.0 |     | 40 | 70 |    |

Preparation of Pigmented Compositions
Production of Red, Green and Blue Dispersions Used for Color Filter Application
PG-58: Fastogen Green A110 (DIC)
PR-254: Irgaphor Red BT-CF (BASF)
PB-15:6: Fastogen Blue EP-193 (DIC)
LP N 6919: BYK-LP N 6919, diblock copolymer, non volatile=60%, amine value=72 mg-KOH/g (BYK-Chemie)
DIS-111: DISPERBYK-111, acidic polymer, acid value=129 mg-KOH/g (BYK-Chemie)

General procedure for producing dispersion R-1 used for color filter application:

4.3 g of alkali-soluble resin R1 and 9.4 g of the dispersant S-2, shown in table 5, were placed into a 140 ml glass bottle. After that, 28.8 g of PMA was added to the glass bottle to dissolve the alkali-soluble resin R1 and the dispersant. Then, 7.5 g of PR-254 and 150 g of zirconia beads (diameter: 0.4-0.6 mm) were added into the glass bottle. The dispersion process was performed in a LAU-Disperser DAS 200 over a period of 5 hours at 30° C. After 5 hours, the concentrate was filtered into a 50 ml glass bottle to remove the zirconia beads.

General procedure for producing dispersions R-2, G-1-G-10 and B-1-B-3 used for color filter application Dispersions R-2, G-1-G-10 and B-1-B-3 were prepared according to the procedure for dispersion R-1 (Details are described in Table 6).

TABLE 6

Recipes of red, green and blue dispersions used for color filter application

| | Pigment | | Dispersant [weight-%] Aminic polymer | | | Alkali-soluble resin R1 [weight-%] | Solvent PMA [weight-%] |
|---|---|---|---|---|---|---|---|
| Dispersion | Name | Amount [weight-%] | Product name | Amount | DIS-111 | | |
| R-1 | PR-254 | 7.5 | S-2 | 9.4 | | 4.3 | 28.8 |
| R-2* | PR-254 | 7.5 | LP N 6919 | 5.9 | 3.5 | 4.3 | 28.8 |
| G-1 | PG-58 | 7.5 | S-6 | 9.4 | | 4.3 | 28.8 |
| G-2 | PG-58 | 7.5 | S-7 | 9.4 | | 4.3 | 28.8 |
| G-3 | PG-58 | 7.5 | S-8 | 9.4 | | 4.3 | 28.8 |
| G-4* | PG-58 | 7.5 | S-12* | 9.4 | | 4.3 | 28.8 |
| G-5* | PG-58 | 7.5 | S-14* | 9.4 | | 4.3 | 28.8 |
| G-6* | PG-58 | 7.5 | S-15* | 9.4 | | 4.3 | 28.8 |
| G-7* | PG-58 | 7.5 | S-16* | 9.4 | | 4.3 | 28.8 |
| G-8* | PG-58 | 7.5 | LP N6919 | 5.9 | 3.5 | 4.3 | 28.8 |
| G-9* | PG-58 | 7.5 | DB-5 | 9.4 | | 4.3 | 28.8 |

TABLE 6-continued

Recipes of red, green and blue dispersions used for color filter application

| | | Dispersant [weight-%] | | | Alkali-soluble resin R1 [weight-%] | Solvent PMA [weight-%] |
|---|---|---|---|---|---|---|
| | Pigment | Aminic polymer | | | | |
| Dispersion | Name | Amount [weight-%] | Product name | Amount | DIS-111 | |
| G-10* | PG-58 | 7.5 | DB-5 | 3.8 | 6.4 | 32.3 |
| B-1 | PB-15:6 | 7.5 | S-11 | 9.4 | 4.3 | 28.8 |
| B-2 | PB-15:6 | 7.5 | S-13 | 9.4 | 4.3 | 28.8 |
| B-3* | PB-15:6 | 7.5 | S-13* | 9.4 | 4.3 | 28.8 |

Production of Resist Ink

BYK-330: Silicone-type additive (BYK-Chemie)

Aronix M305: Pentaerythritol triacrylate (TOA GOSEI)

Omnirad 369: Former name: Irgacure 369, 2-benzyl-2-(dimethylamino)-4'-morpholinobutyrophenone (IGM Resins B.V.)

The recipe of the resist inks are described as follows;

| | |
|---|---|
| Dispersion | 50.0 g |
| 2% solution of BYK-330 in PMA | 1.0 g |
| Alkali-soluble resin R-1 | 14.2 g |
| Aronix M305 | 2.0 g |
| Omnirad 369 | 1.0 g |
| PMA | 31.8 g |
| Total | 100.0 g |

Application Test Results

Viscosity of red, green and blue dispersions

Viscosity of red, green and blue dispersions were measured by using BROOKFIELD VISCOMETER DV-II+ (BROOKFIELD, upper limitation of viscosity: 1000 mPa·s).

Particle size of red, green and blue dispersions: Particle size (median diameter: D50) of red, green and blue dispersion were measured by using Particle Size Analyzer ELSZ-1000 (Otsuka Electronics).

Developing Property

Red, Green and Blue resist inks were coated to glass plate by using bar coater No. 4 (9.16 μm of thickness at wetting-film), and the coating films were dried at 80° C. for 3 minutes. The dried coating films were gradually dipped to 0.05% KOH aqueous solution (interval: 10-60 seconds).

After washing them by water, the coating films were wiped by using KimWipes (Kimberly Clark Corporation product), and marked appearance of coating film described as follows;

1 (Excellent): The coating film was completely eliminated after wiping 2 (Very good): The coating film was partially eliminated after wiping 3 (Good): The coating film was not eliminated, but the surface of the coating film was mostly removed after wiping 4 (Poor): The coating film was not eliminated, but the surface of the coating film was partially removed after wiping 5 (Miserable): The appearance of the coating film didn't change after wiping Re-Solubility in PMA Red, Green and Blue resist inks were coated to glass plate by using bar coater No. 4 (9.16 μm of thickness at wetting-film), and the coating films were dried at 80° C. for 3 minutes. One droplet of PMA was put on the coating film, and wiped immediately by using KimWipes. The appearance of the coating film after wiping was marked as follows;

1 (Excellent): The coating film in the trace of PMA droplet was completely eliminated after wiping 2 (Very good): The coating film in the trace of PMA droplet was partially eliminated after wiping 3 (Good): The coating film in the trace of PMA was not eliminated, but the surface of the coating film was mostly removed after wiping 4 (Poor): The coating film was in the trace of PMA not eliminated, but the surface of the coating film was partially removed after wiping 5 (Miserable): The appearance of the coating film didn't change after wiping Example 1-6: Viscosity and Particle Size of Red (R), Green (G) and Blue (B) Dispersions, and Developing Property and Re-Solubility in PMA of Red (R), Green (G) and Blue (B) Resist Inks Viscosity (mPa·s at 20° C., rotation: 60 rpm) and particle size (D50) of red, green and blue dispersions as well as developing property and re-solubility in PMA of red, green and blue resist inks are described in Table 7.

TABLE 7

Viscosity and particle size of red, green and blue dispersions, and developing property and re-solubility in PMA of red, green and blue resist inks

| | | Viscosity (mPa · s) of dispersion (60 rpm) | | | Property of resist ink | |
|---|---|---|---|---|---|---|
| Examples | Dispersion | Initial | at 40° C. for 5 days | Particle size (D50)/nm | Developing property | Re-solubility in PMA |
| 1 | R-1 | 6.4 | 6.6 | 72 | 1 | 1 |
| 2 | G-1 | 5.1 | 5.6 | 63 | 3 | 1 |
| 3 | G-2 | 3.8 | 4.4 | 57 | 2 | 1 |
| 4 | G-3 | 3.8 | 4.3 | 65 | 1 | 1 |
| 5 | B-1 | 5.0 | 5.1 | 60 | 1 | 1 |
| 6 | B-2 | 4.8 | 4.8 | 62 | 1 | 1 |

Comparison example C-1 to C-9: Viscosity and particle size of red (R), green (G) and blue (B) dispersions, and developing property and re-solubility in PMA of red, green and blue resist inks;

Viscosity (mPa·s at 20° C., rotation: 60 rpm) and particle size (D50) of red, green and blue dispersions are described in Table 8, and developing property and re-solubility in PMA of red, green and blue resist inks are described in Table 8.

TABLE 8

Viscosity and particle size of red, green and blue dispersions, and developing property and re-solubility in PMA of red, green and blue resist inks

| Comparison examples | Dispersion | Viscosity (mPa · s) of dispersion (60 rpm) | | Particle size (D50)/nm | Property of resist ink | |
|---|---|---|---|---|---|---|
| | | Initial | Storage at 40° C. for 5 days | | Developing property | Re-solubility in PMA |
| C-1 | R-2* | 6.4 | 9.6 | 80 | 3 | 3 |
| C-2 | G-4* | >100 | Gelation | 342 | | |
| C-3 | G-5* | 5.3 | 5.8 | 68 | 4 | 3 |
| C-4 | G-6* | 5.6 | 7.0 | 70 | 4 | 3 |
| C-5 | G-7* | 6.0 | 7.8 | 90 | 5 | 2 |
| C-6 | G-8* | 5.6 | 6.8 | 60 | 3 | 3 |
| C-7 | G-9* | 8.7 | 7.6 | 60 | 5 | 4 |
| C-8 | G-10* | 5.5 | 47.3 | 72 | 5 | 2 |
| C-9 | B-3* | >100 | Gelation | 267 | | |

According to the results in Table 7 and 8, red, green and blue dispersions including neutralized product between aminic diblock copolymer or aminic triblock copolymer and acidic polymer show excellent dispersibility and storage stability (Example 1-6). Moreover, red, green and blue resist inks including the dispersions also show excellent developing property and re-solubility in PMA. However, red and green dispersions including BYK-LP N 6919 and DISPERBYK-111 which added during the grinding process (Comparison example C-1 and C-6) show lower storage stability, and their resist inks also show poor developing property and re-solubility in PMA.

Green and blue dispersions including aminic random copolymer and acidic polymer (Comparison example C-2 and C-9) show poor dispersibility.

Green dispersions including aminic block copolymer and low molecular weight of acidic component (Comparison example C-3 to C-5) show poor storage stability, and their resist inks show poor developing property and re-solubility in PMA.

Production of Carbon Black Dispersions Used for Solvent-Based Dark Black Coating Raven U3: Raven 5000 Ultra 3 (Birla Carbon)

Butyl acetate (Sigma-Aldrich)

General procedure for producing solvent-based carbon black dispersion Bk-1:

9.7 g of a dispersant was placed into a 140 ml glass bottle. After that, 36.0 g of butyl acetate was added to the glass bottle to dissolve the dispersant. Then, 4.3 g of Raven 5000 Ultra 3 (Raven U3) and 150 g of zirconia beads (diameter: 0.4-0.6 mm) were added into the glass bottle. Dispersion process was performed in a LAU-Disperser DAS 200 over a period of 10 hours at 30° C. After 10 hours, the concentrate was filtered into a 50 ml glass bottle to remove the zirconia beads.

General procedure for producing carbon black solvent-based dispersion Bk-2-Bk-5:

Solvent-based dispersions Bk-2-Bk-5 were according to the procedure dispersion Bk-1 (Details are described in Table 9).

TABLE 9

Recipes of solvent-based carbon black dispersions Bk-1-Bk-5

| | Pigment | | Dispersant | | Solvent |
|---|---|---|---|---|---|
| Dispersion | Name | Amount [weight-%] | Product name | Amount [weight-%] | Butyl acetate [weight-%] |
| Bk-1 | Raven U3 | 4.3 | S-1 | 9.7 | 36.0 |
| Bk-2 | Raven U3 | 4.3 | S-5 | 9.7 | 36.0 |
| Bk-3 | Raven U3 | 4.3 | S-11 | 9.7 | 36.0 |
| Bk-4 | Raven U3 | 4.3 | S-12 | 9.7 | 36.0 |
| Bk-5* | Raven U3 | 4.3 | DB-5 | 6.5 | 39.2 |

Example 7-10: Viscosity and Particle Size of Solvent-Based Carbon Black Dispersions Bk-1-Bk-4

Viscosity (mPa·s at 20° C., rotation: 60 rpm) and particle size (D50) of solvent-based carbon black dispersions Bk-1-Bk-4 are described in Table 10.

TABLE 10

Viscosity and particle size of solvent-based carbon black dispersions Bk-1-Bk-4

| Examples | Dispersion | Viscosity (mPa · s) of dispersion (60 rpm) | | Particle size (D50)/nm |
|---|---|---|---|---|
| | | Initial | Storage at 40° C. for 5 days | |
| 7 | Bk-1 | 59 | 57 | 102 |
| 8 | Bk-2 | 46 | 54 | 93 |
| 9 | Bk-3 | 19 | 19 | 83 |
| 10 | Bk-4 | 21 | 20 | 80 |

Comparison Example 10: Viscosity and Particle Size of Solvent-Based Carbon Black Dispersions Bk-5

Viscosity (mPa·s at 20° C., rotation: 60 rpm) and particle size (D50) of solvent-based carbon black dispersions Bk-5 are described in Table 11.

TABLE 11

Viscosity and particle size of solvent-based carbon black dispersions Bk-5

| Comparison example | Dispersion | Viscosity (mPa · s) of dispersion (60 rpm) | | Particle size (D50)/ nm |
|---|---|---|---|---|
| | | Initial | Storage at 40° C. for 5 days | |
| C-10 | Bk-5 | >100 | Gelation | 189 |

According to the results in Table 10 and 11, neutralized product between aminic block copolymer and acidic polymer showed lower viscosity, improved storage stability and lower particles size when used as dispersant for solvent-based carbon black dispersion suitable for coatings for transportation vehicles. On the other hand, non-neutralized aminic block copolymer showed poor dispersibility.

Production of Waterborne Dispersions Used for Inkjet Application

Yellow 3GL-TP: (Clariant)
Inkjet Yellow 4GC: Pigment Yellow 155 (Clariant)
Riaplas Red 2BL-TP: (Clariant)
Inkjet Magenta E7B VP3958: (Clariant)

General procedure for producing waterborne dispersion Y-1:

10.0 g of dispersant S-3 was placed into a 140 ml glass bottle. After that, 10.0 g of deionized water was added to the glass bottle and mixing homogeneously. Then, 10.0 g of Yellow 3GL-TP and 150 g of zirconia beads (diameter: 0.4-0.6 mm) were added into the glass bottle.

Dispersion process was performed in a LAU-Disperser DAS 200 over a period of 16 hours at 30° C. After 16 hours, the concentrate was filtered into a 50 ml glass bottle to remove the zirconia beads.

General procedure for producing waterborne dispersions Y-2-Y-3, Re-1 and M-1-M-2

Waterborne dispersions were prepared using the same procedure as used for waterborne dispersion Y-1, except using different dispersants and different dosages (Details are described in Table 12).

TABLE 12

Recipes of waterborne dispersions Y-1-Y-3, Re-1, M-1 and M-2

| Dispersion | Pigment | | Dispersant [weight-%] | | Deionized water [weight-%] |
|---|---|---|---|---|---|
| | Name | Amount [weight-%] | Product name | Amount | |
| Y-1 | Yellow 3GL-TP | 10.0 | S-3 | 10.0 | 30.0 |
| Y-2* | Yellow 3GL-TP | 10.0 | NS-1 | 10.0 | 30.0 |
| Y-3 | Inkjet Yellow 4GC | 10.0 | S-4 | 5.0 | 35.0 |
| Re-1 | Riaplas Red 2BL-TP | 10.0 | S-3 | 5.0 | 35.0 |
| M-1 | Inkjet Magenta E7B VP3958 | 10.0 | S-4 | 12.5 | 27.5 |
| M-2* | Inkjet Magenta E7B VP3958 | 10.0 | NS-1 | 12.5 | 27.5 |

Example 11-14: Viscosity and Particle Size of Waterborne Dispersions Y-1, Y-3, Re-1 and M-1

Viscosity (mPa·s at 20° C., rotation: 60 rpm) and particle size (D50) of waterborne dispersions Y-1, Y-3, Re-1 and M-1 are described in Table 13.

TABLE 13

Viscosity and particle size of waterborne dispersions Y-1, Y-3, Re-1 and M-1

| Examples | Dispersion | Viscosity (mPa · s) of dispersion (60 rpm) | | Particle size (D50)/ nm |
|---|---|---|---|---|
| | | Initial | Storage at 70° C. for 7 days | |
| 11 | Y-1 | 4.2 | 3.7 | 82 |
| 12 | Y-3 | 5.0 | 4.7 | 84 |
| 13 | Re-1 | 3.7 | 5.1 | 90 |
| 14 | M-1 | 14.1 | 11.9 | 78 |

Comparison Example 11-12: Viscosity and Particle Size of Waterborne Dispersions Y-2 and M-2

Viscosity (mPa·s at 20° C., rotation: 60 rpm) and particle size (D50) of waterborne dispersions Y-2 and M-2 are described in Table 14.

TABLE 14

Viscosity and particle size of waterborne dispersions Y-2 and M-2

| Comparison examples | Dispersion | Viscosity (mPa · s) of dispersion (60 rpm) | | Particle size (D50)/ nm |
|---|---|---|---|---|
| | | Initial | Storage at 70° C. for 7 days | |
| C-11* | Y-2 | 5.2 | 11.3 | 91 |
| C-12* | M-2 | 14.0 | Gelation | 82 |

According to the results in Table 13 and 14, neutralized product between aminic block copolymer and acidic polymer showed good results as dispersant for waterborne dispersion used for inkjet application. In particular, the inventive examples exhibited an improved storage stability compared to non-neutralized aminic block copolymer.

The invention claimed is:

1. A non-pigmented composition comprising: a block co-polymer comprising at least one first block and at least one second block which is different from the first block, wherein the first block comprises repeating unit 1,

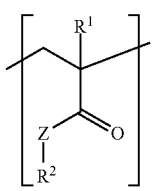

repeating unit 1 and the second block comprises repeating unit 2,

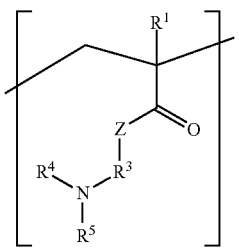

repeating unit 2 wherein

Z represents O or NH, $R^1$ represents H or $CH_3$, $R^2$ represents a hydrocarbyl group or an ether group-containing group, $R^3$ represents an organic group having 2 to 4 carbon atoms, $R^4$ and $R^5$ independently represent an organic group, wherein $R^4$ and $R^5$ are optionally linked to each other to form a cyclic structure, and a polymer comprising at least one acidic group, and having a number average molecular weight of 300 g/mol or higher, wherein the repeating unit 2 of the block co-polymer is at least partially present as salt of the polymer comprising the at least one acidic group, and wherein the composition is essentially free of pigments, dyes, and inorganic filler materials.

2. The composition according to claim 1, wherein the at least one acidic group comprises at least one of a carboxylic acid group, an acidic group containing phosphorus, and a sulfonic acid group.

3. The composition according to claim 1, wherein the polymer comprising the at least one acidic group has an average functionality in the range of 0.9 to 1.2 acidic groups per molecule.

4. The composition according to claim 1, wherein the molar ratio of repeating unit 2 of the block co-polymer and the at least one acidic group of the polymer is in the range of 1.00:0.20 to 1.00:1.25.

5. The composition according to claim 1, wherein the polymer comprising the at least one acidic group further comprises one or more of an ether group and an ester group.

6. The composition according to claim 1, wherein the block co-polymer further comprises at least one third block.

7. The composition according to claim 6, wherein in the block co-polymer the at least one second block comprising repeating unit 2 is located between the at least one first block and the at least one third block.

8. The composition according to claim 7, wherein the at least one first block and the at least one third block have the same type of repeating unit 1.

9. The composition according to claim 7, wherein the at least one first block and the at least one third block have different types of repeating unit 1.

10. The composition according to claim 6, wherein in the block co-polymer the at least one third block comprises a different type of repeating unit 1 than the at least one first block, and wherein the at least one third block is located between at least one first block and the at least one second block.

11. A process of preparing a colored composition, the process comprising:
providing a composition according to claim 1,
adding one or more color imparting pigments or dyes to the composition, and
dispersing the one or more pigments or dyes in the composition to form a colored composition.

12. The process according to claim 11, wherein the colored composition is an inkjet ink composition.

13. The process according to claim 11, wherein the colored composition comprises a color filter composition.

14. The process according to claim 11, wherein the colored composition comprises a coating composition for transportation vehicles.

* * * * *